US008816266B2

(12) United States Patent
Watanabe

(10) Patent No.: US 8,816,266 B2
(45) Date of Patent: Aug. 26, 2014

(54) SOLID-STATE IMAGING DEVICE, METHOD FOR DRIVING SOLID-STATE IMAGING DEVICE, AND ELECTRONIC APPARATUS

(71) Applicant: Sony Corporation, Tokyo (JP)

(72) Inventor: Kazufumi Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/671,677

(22) Filed: Nov. 8, 2012

(65) Prior Publication Data

US 2013/0070141 A1 Mar. 21, 2013

Related U.S. Application Data

(63) Continuation of application No. 12/717,515, filed on Mar. 4, 2010, now Pat. No. 8,314,376.

(30) Foreign Application Priority Data

Mar. 12, 2009 (JP) .................................. 2009-058984

(51) Int. Cl.
*H01L 27/148* (2006.01)
*H01L 31/09* (2006.01)
*H04N 5/353* (2011.01)
*H04N 5/3745* (2011.01)
*H01L 27/146* (2006.01)

(52) U.S. Cl.
CPC ..... *H01L 27/14609* (2013.01); *H01L 27/14627* (2013.01); *H01L 27/14636* (2013.01); *H04N 5/353* (2013.01); *H01L 27/14643* (2013.01); *H04N 5/37457* (2013.01); *H01L 27/14621* (2013.01)
USPC ....................................... 250/208.1; 348/308

(58) Field of Classification Search
USPC ........ 250/208.1, 214 A, 214.1; 257/290–292; 348/308, 302, 294
See application file for complete search history.

(56) References Cited

U.S. PATENT DOCUMENTS

| | | | |
|---|---|---|---|
| 2002/0195563 A1 | 12/2002 | Lida et al. | |
| 2004/0108460 A1 | 6/2004 | Lida et al. | |
| 2005/0224853 A1* | 10/2005 | Ohkawa | 257/296 |
| 2006/0205137 A1* | 9/2006 | Hong | 438/211 |
| 2007/0034917 A1* | 2/2007 | Rhodes | 257/292 |
| 2007/0215970 A1 | 9/2007 | Lee et al. | |
| 2009/0303365 A1 | 12/2009 | Watanabe | |
| 2010/0194958 A1 | 8/2010 | Honda et al. | |

FOREIGN PATENT DOCUMENTS

| | | |
|---|---|---|
| JP | 11-177076 | 7/1999 |
| JP | 2000-156491 | 6/2000 |

(Continued)

OTHER PUBLICATIONS

Japanese Office Action from Japanese counterpart application No. 2009-058984 dated Feb. 5, 2013.

*Primary Examiner* — Seung C Sohn
(74) *Attorney, Agent, or Firm* — Dentons US LLP

(57) ABSTRACT

A solid-state imaging device comprising a plurality of unit pixels each comprising (a) a photoelectric conversion element operative to generate a charge in response to incident light, (b) a first storage element in which the charge generated by the photoelectric conversion element is stored and (c) a second storage element in which a charge based on the charge stored in the first storage element is stored, wherein, for each pixel, the second storage element is located at an opposite side of a light receiving surface of the photoelectric conversion element.

17 Claims, 8 Drawing Sheets

(56) References Cited

FOREIGN PATENT DOCUMENTS

| JP | 2002-344809 | 11/2002 |
| JP | 2004-274229 | 9/2004 |
| JP | 2005-065074 | 3/2005 |
| JP | 2007-178314 | 7/2007 |
| JP | 2008-042826 | 2/2008 |
| JP | 2008-177706 | 7/2008 |
| JP | 2010-178117 | 8/2010 |

* cited by examiner

SOLID-STATE IMAGING DEVICE, METHOD FOR DRIVING SOLID-STATE IMAGING DEVICE, AND ELECTRONIC APPARATUS

RELATED APPLICATION DATA

This application is a continuation of U.S. patent application Ser. No. 12/717,515, filed Mar. 4, 2010, the entirety of which is incorporated herein by reference to the extent permitted by law. This application claims the benefit of priority to Japanese Patent Application No. JP 2009-058984 filed in the Japanese Patent Office on Mar. 12, 2009, the entirely of which is incorporated herein by reference to the extent permitted by law.

BACKGROUND OF THE INVENTION

1. Field of the Invention

The present invention relates to a solid-state imaging device, a method for driving the solid-state imaging device, and an electronic apparatus. The present invention particularly relates to an X-Y address type solid-state imaging device having a global shutter function, a method for driving the solid-state imaging device, and an electronic apparatus including the solid-state imaging device.

2. Description of the Related Art

There are two main types of solid-state imaging devices: an X-Y address type solid-state imaging device such as a CMOS (complementary metal oxide semiconductor) image sensor; and a charge transfer type solid-state imaging device such as a CCD (charge coupled device) image sensor. The CMOS image sensor is capable of random access to pixel signals, and also has advantages of fast pixel signal reading and low power consumption as compared with the CCD image sensor.

Most CMOS image sensors transfer a signal charge stored in a photoelectric conversion part to a charge-to-voltage conversion part, and output a voltage obtained in the charge-to-voltage conversion part. An electronic shutter function can be achieved by periodically resetting the charge-to-voltage conversion part. A shutter method of the electronic shutter function in such CMOS image sensors is a method in which a so-called rolling shutter (also referred to as a focal plane shutter) is used, which sets the start and end of exposure for each pixel row of a large number of pixels in a two-dimensional array.

A rolling-shutter-based CMOS image sensor has an exposure time shifted (different) for each pixel row, unlike a global-shutter-based CCD image sensor that performs exposure for all pixels at the same timing. When the exposure time is shifted for each pixel row, in the case of capturing an image of a moving object, the captured image is distorted.

To achieve the global shutter function, in the related art, a charge storage capacitor is connected in parallel with a floating diffusion part that converts a charge to a signal voltage in a pixel, and the charge is stored in the capacitor (for example, see Japanese Unexamined Patent Application Publication No. 11-177076).

Moreover, to achieve the global shutter function and also enable the signal voltage to be amplified in the pixel, two charge storage capacitors are provided per pixel, and an amplification function is realized using a capacitance ratio between the two capacitors (for example, see Japanese Unexamined Patent Application Publication No. 2005-65074).

SUMMARY OF THE INVENTION

In the related art technique described in Japanese Unexamined Patent Application Publication No. 11-177076, a large capacitance value of the charge storage capacitor is necessary for extending charge retention time and improving noise immunity. However, the large capacitance value of the charge storage capacitor causes an increase in capacitance of the floating diffusion part, which results in a decrease in charge-to-voltage conversion efficiency. That is, the charge retention time of the charge storage capacitor and the conversion efficiency of the floating diffusion part are in a tradeoff relationship.

Moreover, the charge storage capacitor is intended to be able to retain the whole charge completely transferred from the photoelectric conversion part. Accordingly, a same size of area as the photoelectric conversion part is necessary as an area of the charge storage capacitor. Hence, the related art technique described in Japanese Unexamined Patent Application Publication No. 11-177076 is not suitable for pixel size reduction. In addition, due to its structure of logarithmically compressing a signal and amplifying the signal by a current mirror circuit, in order to suppress a variation in threshold voltage Vth of an amplifying transistor and increase an amplification factor, it is necessary to increase the amplifying transistor in size. Therefore, the related art technique described in Japanese Unexamined Patent Application Publication No. 11-177076 is not suitable for miniaturization. Besides, since KTC noise upon reset may not be removed, it is difficult to suppress pixel-specific fixed pattern noise.

In the related art technique described in Japanese Unexamined Patent Application Publication No. 2005-65074, two reset transistors each for resetting a different one of the two charge storage capacitors are further necessary. This increases the number of components that are to be integrated in one pixel, thereby making high integration difficult. Moreover, two reset signal lines are necessary at least for pixel reset, which complicates the structures of peripheral driving circuits for driving pixels.

It is therefore desirable to provide a solid-state imaging device that achieves high integration without a decrease in conversion efficiency when converting a charge to a voltage, a method for driving the solid-state imaging device, and an electronic apparatus including the solid-state imaging device.

A solid-state imaging device according to an embodiment of the present invention has unit pixels arranged therein, each unit pixel including: a photoelectric conversion part; an FD (floating diffusion) part; a transfer transistor configured to transfer a charge from the photoelectric conversion part to the FD part; a first reset transistor configured to reset the FD part; a charge storage capacitor; a charging transistor configured to charge the charge storage capacitor in accordance with a charge in the FD part; a second reset transistor configured to reset the charge storage capacitor; an amplifying transistor configured to output an electric signal corresponding to a charge in the charge storage capacitor; and a selection transistor configured to selectively cause the amplifying transistor to be in an operation state.

In the solid-state imaging device with the above structure, since the charging transistor is interposed between the FD part and the charge storage capacitor having a global shutter function, the charge storage capacitor is not connected in parallel with the capacitance of the FD part. Therefore, the insertion of the charge storage capacitor does not cause a significant change in capacitance value of the FD part. This makes it possible to satisfy both the charge retention time of the charge storage capacitor and the conversion efficiency of the FD part which are in a tradeoff relationship. In detail, by setting a large capacitance value of the charge storage capacitor, an extended charge retention time of the charge storage capacitor and improved noise immunity can be attained without a decrease in conversion efficiency of the FD part. Moreover, the global shutter function is available with a small number of components, where only one charge storage capacitor and two transistors (the charging transistor and the second reset transistor) are added to each unit pixel.

According to the embodiment of the present invention, it is possible to satisfy both the charge retention time of the charge storage capacitor and the conversion efficiency of the FD part which are in a tradeoff relationship, and also achieve the global shutter function with a small number of components. Hence, high integration can be attained without a decrease in conversion efficiency of the FD part.

DESCRIPTION OF THE PREFERRED EMBODIMENTS

Embodiments of the present invention are described below in detail, with reference to the drawings. The description is given in the following order.

1. Solid-state imaging device to which an embodiment of the present invention is applied (a CMOS image sensor as an example)
2. Embodiment (an individual pixel example)
3. Another embodiment (a pixel sharing example)
4. Charge storage capacitor (a stack capacitor as an example)
5. Modifications
6. Electronic apparatus according to an embodiment of the present invention (an imaging apparatus as an example)

<1. Solid-state Imaging Device According to an Embodiment of the Present Invention>

(System Structure)

Figure 1:
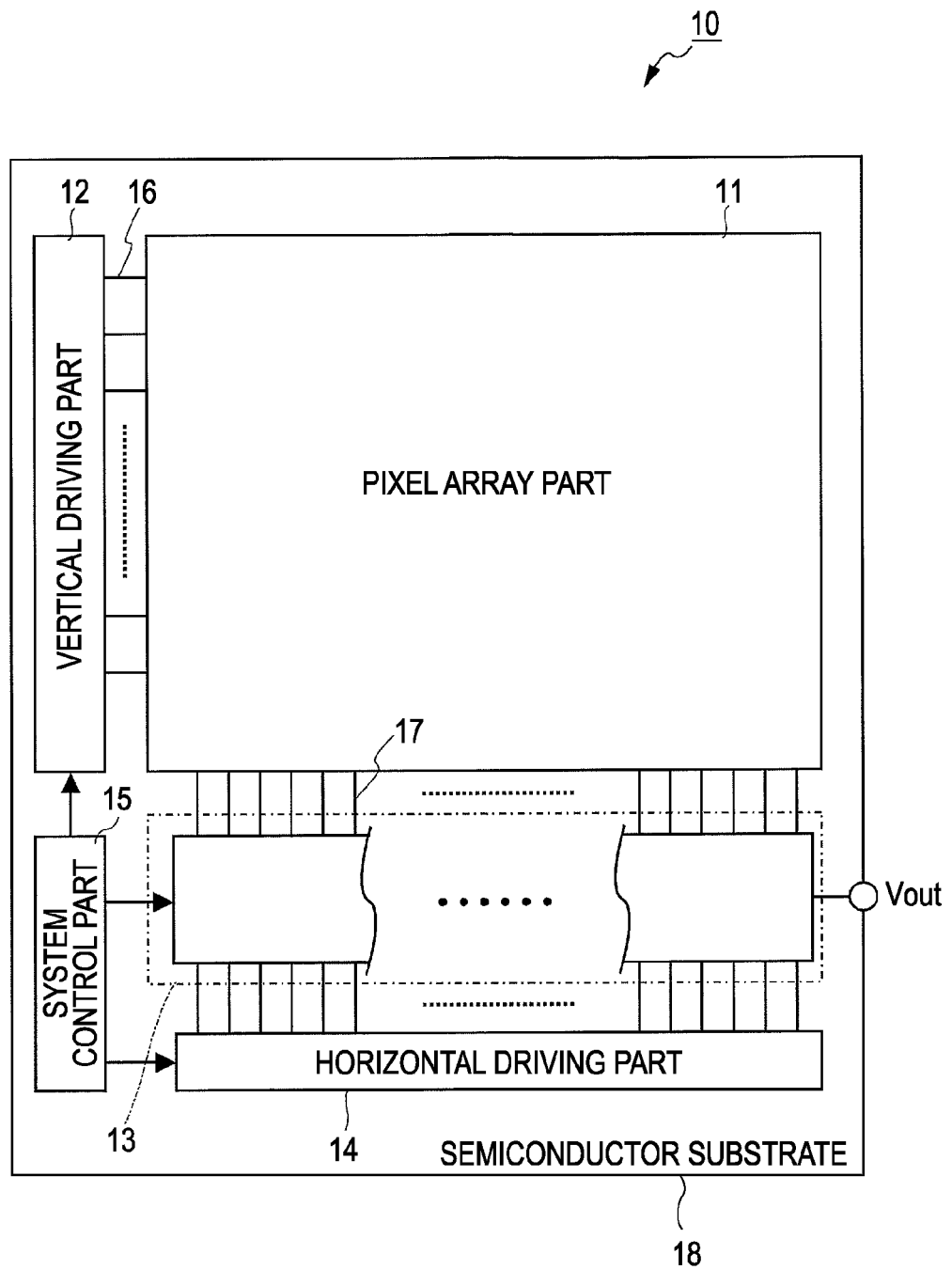
FIG. 1 is a system structure diagram schematically showing the structure of a CMOS image sensor to which an embodiment of the present invention is applied.

FIG. 1 is a system structure diagram schematically showing the structure of a CMOS image sensor which is one type of a solid-state imaging device, such as an X-Y address type solid-state imaging device, to which an embodiment of the present invention is applied. The CMOS image sensor mentioned here is an image sensor which is made by applying or partially using a CMOS process.

As shown in FIG. 1, a CMOS image sensor 10 according to this application example includes a pixel array part 11 formed on a semiconductor substrate (chip) 18, and peripheral circuit parts integrated on the same semiconductor substrate 18 as the pixel array part 11. For example, a vertical driving part 12, a column processing part 13, a horizontal driving part 14, and a system control part 15 are provided as the peripheral circuit parts.

In the pixel array part 11, unit pixels (also simply referred to below as pixels), not shown, that each include a photoelectric conversion part (for example, a photodiode) for photoelectrically converting incident visible light to the amount of charge corresponding to the amount of light are arranged in a two-dimensional array of a matrix. Though not shown, each individual pixel is provided with a lens for gathering incident light, namely, a microlens, a color filter in the case of a color image sensor, and the like. A specific structure of a unit pixel will be described later.

Furthermore, in the pixel array part 11, a pixel driving line 16 is formed for each row of the matrix pixel array along the left/right direction in the drawing (the pixel array direction of each pixel row, that is, a horizontal direction), and a vertical signal line 17 is formed for each column of the matrix pixel array along the up/down direction in the drawing (the pixel array direction of each pixel column, that is, the vertical direction). Though the pixel driving line 16 is shown as a single line in FIG. 1, the pixel driving line 16 is not limited to a single line. One end of the pixel driving line 16 is connected to an output end of the vertical driving part 12 corresponding to the row.

The vertical driving part 12 is composed of a shift register, an address decoder, and the like. Though its detailed structure is not shown here, the vertical driving part 12 has a read scanning system and a sweep scanning system. The read scanning system sequentially performs selective scanning on a row-by-row basis, for unit pixels from which signals are read.

The sweep scanning system performs, for a read row that is subject to the read scanning by the read scanning system, sweep scanning of sweeping (resetting) an unwanted charge from a photoelectric conversion element of each unit pixel in the read row, a shutter speed period prior to the read scanning. The so-called electronic shutter operation is carried out by the sweeping (reset) of the unwanted charge by this sweep scanning system. The electronic shutter operation mentioned here is an operation of discarding a photocharge of a photoelectric conversion element and newly starting exposure (starting photocharge storage).

A signal read by the reading operation of the read scanning system corresponds to an amount of light incident after the immediately preceding reading operation or electronic shutter operation. A period from a timing of reading by the immediately preceding reading operation or a timing of sweeping by the electronic shutter operation to a timing of reading by the current reading operation is a photocharge storage time (exposure time) in a unit pixel.

A signal output from each unit pixel of a pixel row selectively scanned by the vertical driving part 12 is supplied to the column processing part 13 via the corresponding vertical signal line 17. The column processing part 13 performs predetermined signal processing on the analog pixel signal output from each pixel 20 of the selected row, per pixel column of the pixel array part 11.

The signal processing in the column processing part 13 is, for example, a CDS (correlated double sampling) process. The CDS process is a process of taking in a reset level and a signal level output from each pixel of the selected row and calculating a difference between these levels to obtain pixel signals corresponding to one row, and also removing fixed pattern noise of pixels. The column processing part 13 may have an AD conversion function for digitizing analog pixel signals.

The horizontal driving part 14 is composed of a shift register, an address decoder, and the like, and sequentially performs selective scanning on circuit portions of the column processing part 13 corresponding to the pixel columns. By the selective scanning by this horizontal driving part 14, pixel signals which have undergone the signal processing per pixel column in the column processing part 13 are sequentially output.

The system control part 15 receives a clock provided from outside the semiconductor substrate 18, data for instructing an operation mode, and the like, and outputs data such as internal information of the CMOS image sensor 10. The system control part 15 also includes a timing generator for generating various timing signals, and controls the driving of the vertical driving part 12, the column processing part 13, the horizontal driving part 14, and the like on the basis of the various timing signals generated by the timing generator.

In the CMOS image sensor 10 having the above structure, by adding a charge storage capacitor for temporarily storing a charge to the unit pixel 20, it is possible to achieve the global shutter function of performing exposure for all pixels at the same timing. Here, to perform exposure for all pixels at the same timing means to simultaneously start exposure for all pixels and simultaneously end the exposure for all pixels. A specific embodiment of the unit pixel 20 in the case of adding the charge storage capacitor for achieving the global shutter function is described below.

<2. Embodiment>
[Circuit Structure]

Figure 2:
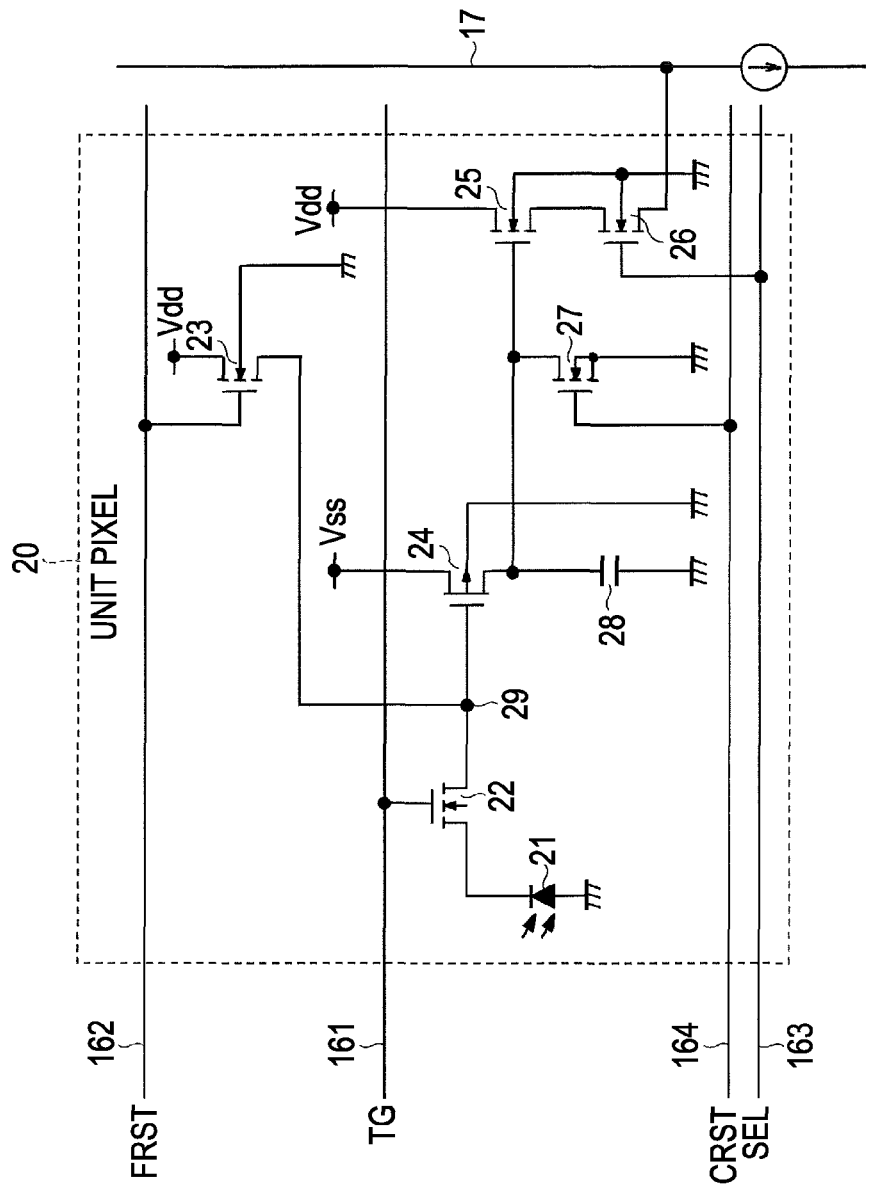
FIG. 2 is a circuit diagram showing a circuit structure of a unit pixel according to an embodiment of the present invention.

FIG. 2 is a circuit diagram showing a circuit structure of the unit pixel 20 according to an embodiment. As shown in FIG. 2, the unit pixel 20 according to the embodiment includes, for example, six transistors 22 to 27 and one capacitor 28, in addition to, for example, a photodiode 21 which is a photoelectric conversion part. The capacitor 28 is the charge storage capacitor for achieving the global shutter function.

For instance, N-channel MOS transistors are used as the transistors 22, 23, and 25 to 27 and a depression type MOS transistor is used as the transistor 24. However, the conductivity type combination of the transistors 22 to 27 exemplified here is merely an example, and the conductivity type combination is not limited to such.

For this unit pixel 20, for example, four pixel driving lines of a transfer line 161, a first reset line 162, a selection line 163, and a second reset line 164 are wired as the pixel driving line 16 so as to be common to each pixel in the same pixel row. One end of each of the transfer line 161, the first reset line 162, the selection line 163, and the second reset line 164 is connected to an output terminal of the vertical driving part 12 corresponding to the pixel row.

Of the six transistors 22 to 27, the transistor 22 is referred to below as a transfer transistor, the transistor 23 as a first reset transistor, the transistor 24 as a charging transistor, the transistor 25 as an amplifying transistor, the transistor 26 as a selection transistor, and the transistor 27 as a second reset transistor.

The photodiode 21 has an anode electrode grounded, and photoelectrically converts received light to an amount of photocharge (photoelectrons here) corresponding to the amount of light and stores the photocharge. A cathode electrode of the photodiode 21 is connected to one main electrode (drain electrode/source electrode) of the transfer transistor 22 which is a transfer gate.

The other main electrode (source electrode/drain electrode) of the transfer transistor 22 is connected to a gate electrode of the charging transistor 24 which is a transfer gate. A node 29 where the other main electrode of the transfer transistor 22 and the gate electrode of the charging transistor 24 are electrically linked is called an FD (floating diffusion) part. That is, the transfer transistor 22 is connected between the cathode electrode of the photodiode 21 and the FD part 29.

A transfer signal TG that is asserted at a high level (for example, a Vdd level where Vdd is a positive power source level) (referred to below as "active high") is supplied to a gate electrode of the transfer transistor 22 via the transfer line 161. As a result, the transfer transistor 22 becomes on, and transfers the photocharge photoelectrically converted and stored in the photodiode 21 to the FD part 29.

The first reset transistor 23 has a drain electrode connected to the positive power source Vdd, and a source electrode connected to the FD part 29. An active high first reset signal FRST is supplied to a gate electrode of the first reset transistor 23 via the first reset line 162. As a result, the first reset transistor 23 becomes on, and resets the FD part 29 by discarding the charge in the FD part 29 to the pixel power source Vdd.

The charging transistor 24 has the gate electrode connected to the FD part 29, and a drain electrode connected to a negative power source Vss. This charging transistor 24 is composed of, for example, a depression type MOSFET (metal-oxide semiconductor field effect transistor), and charges the charge storage capacitor 28 connected between its source electrode and a reference potential node (for example, the ground) according to the charge in the FD part 29. The charge storage capacitor 28 will be described in detail later.

The charging transistor 24 is preferably a normally-on type device that has a negative threshold voltage and whose conductance varies according to an input voltage. For example, a buried channel MOSFET or JFET (junction FET) is applicable.

The amplifying transistor 25 has a gate electrode connected to one terminal of the charge storage capacitor 28 (the source electrode of the charging transistor 24), and a drain electrode connected to the positive power source Vdd. The amplifying transistor 25 outputs an electric signal corresponding to a charge stored in the charge storage capacitor 28.

The selection transistor 26 has, for example, a drain electrode connected to a source electrode of the amplifying transistor 25, and a source electrode connected to the vertical signal line 17. When an active high selection signal SEL is supplied to its gate electrode via the selection line 163, the selection transistor 26 becomes on, and causes the amplifying transistor 25 to be in an operation state.

That is, the selection transistor 26 sets the unit pixel 20 in a selected state, and relays the signal output from the amplifying transistor 25 to the vertical signal line 17. Alternatively, the selection transistor 26 may have a circuit structure of being connected between the positive power source Vdd and the drain of the amplifying transistor 25.

The second reset transistor 27 has a drain electrode connected to one terminal of the charge storage capacitor 28 (the source electrode of the charging transistor 24), and a source electrode grounded. An active high second reset signal CRST is supplied to a gate electrode of the second reset transistor 27 via the second reset line 164. As a result, the second reset transistor 27 becomes on, and resets the charge storage capacitor 28 by discarding the charge in the charge storage capacitor 28 to the ground.

[Circuit Operation]

As mentioned earlier, the CMOS image sensor 10 formed by arranging the unit pixels 20 with the above structure in a two-dimensional matrix has the electronic shutter function, particularly the global shutter function, that is executed under the driving by the vertical driving part 12.

This global shutter function is achieved by simultaneously resetting the FD part 29 by the first reset transistor 23 in all pixels, and then simultaneously reading a charge from the photodiode 21 in all pixels. The charge reading mentioned here is to read a charge from the photodiode 21 and retain the charge in the FD part 29 or the charge storage capacitor 28 which is a storage device.

Figure 3:
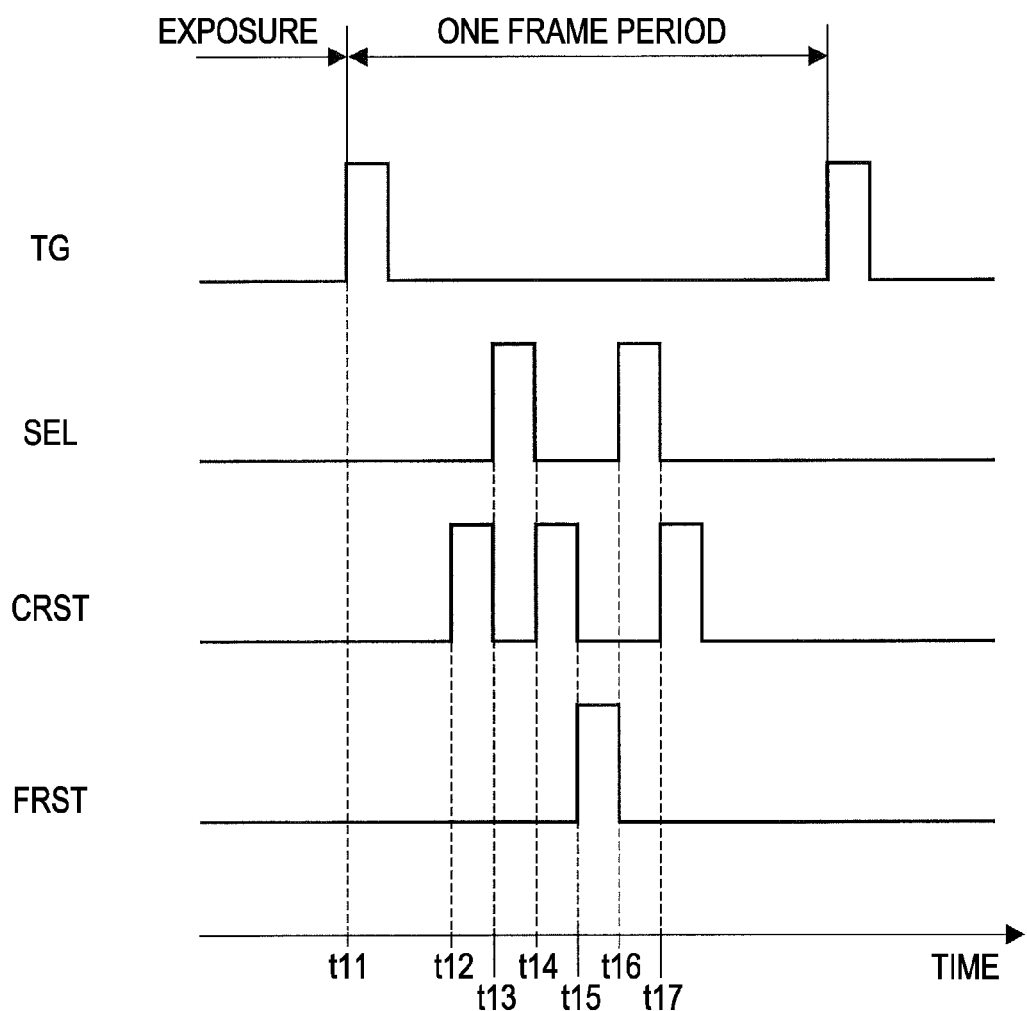
FIG. 3 is a timing chart for explaining a circuit operation of a unit pixel according to the embodiment.

The following describes a circuit operation of the unit pixel 20 with the above structure, using the timing chart of FIG. 3. The timing chart of FIG. 3 shows timing relationships of the pulse signals that are the transfer signal TG, the selection signal SEL, the first reset signal FRST, and the second reset signal CRST. In the description of the circuit operation, it is assumed that the high level (referred to below as H) is a voltage, such as the Vdd level, exceeding the MOSFET threshold voltage Vth, and the low level (referred to below as L) is 0 V.

When the transfer signal TG becomes H at time t11 at which exposure ends, the transfer transistor 22 becomes on and transfers a photocharge stored in the photodiode 21 to the FD part 29. The FD part 29 performs charge-to-voltage conversion, thereby generating a voltage corresponding to the amount of charge transferred from the photodiode 21. The conversion efficiency in the FD part 29 is in inverse proportion to the capacitance value of the FD part 29. The voltage generated in the FD part 29 is applied to the gate electrode of the charging transistor 24 as an input voltage.

Typically, an input impedance of a MOSFET used as the charging transistor 24 is extremely large, so that the charge in the FD part 29 will not be lost as a result of passing through the charging transistor 24 toward the substrate. Accordingly, the voltage in the FD part 29 is held at a voltage VFD that is determined by the amount of charge transferred from the photodiode 21 and the capacitance value of the FD part 29, unless the FD part 29 is reset.

Next, when the second reset signal CRST becomes H at time t12, the second reset transistor 27 becomes on and resets the charge storage capacitor 28. That is, the charge in the charge storage capacitor 28 is discarded to the ground via the second reset transistor 27, as a result of which the charge storage capacitor 28 is reset.

Even when the charge storage capacitor 28 is reset, the voltage VFD of the FD part 29 is unchanged because the charging transistor 24 is interposed between the FD part 29 and the charge storage capacitor 28. Therefore, the input voltage of the charging transistor 24 is unchanged before and after the charge storage capacitor 28 is reset.

The charging transistor 24 feeds a current corresponding to the charge in the FD part 29, that is, the voltage VFD, through the charge storage capacitor 28, thereby charging the charge storage capacitor 28. When the input voltage VFD of the charging transistor 24 and the inter-terminal voltage of the charge storage capacitor 28 become equal to each other, the drain-to-source voltage of the charging transistor 24 becomes 0, so that the charging transistor 24 is turned off.

The turn-off of the charging transistor 24 completes the charging of the charge storage capacitor 28. At this time, the charge stored in the charge storage capacitor 28 contains KTC noise and a fluctuation portion caused by a variation in threshold of the charging transistor 24. KTC noise mentioned here is noise that occurs due to a switching operation of charging the charge storage capacitor 28.

As noted above, the charging transistor 24 is composed of a depression type MOSFET. Since the threshold voltage of the charging transistor 24 is negative, the charging transistor 24 operates in a saturation region when a voltage is applied between the drain and the source, even though no input voltage is applied. That is to say, the on/off control of the charging transistor 24 is performed not by the input voltage but by the drain-to-source voltage. This enables the variation in threshold voltage Vth of the charging transistor 24 to be corrected.

Unlike a depression type MOSFET, an enhancement type MOSFET does not operate in saturation unless an input voltage not smaller than the threshold voltage is applied. That is, in the case where the charging transistor 24 is composed of an enhancement type MOSFET, the on/off control of the enhancement type MOSFET is performed by the input voltage. In this case, it is difficult to correct the variation in Vth of the charging transistor 24.

When the input voltage changes near the threshold voltage of the enhancement type MOSFET, the on/off operation is frequently repeated. This causes switching noise to be carried on a signal, leading to a SN ratio degradation. On the other hand, the depression type MOSFET is constantly on with a negative threshold voltage, and accordingly has no switching noise caused by a change in input voltage.

The inter-terminal voltage of the charge storage capacitor 28 is applied to the gate electrode of the amplifying transistor 25. When the selection signal SEL becomes H at time t13, the selection transistor 26 becomes on, and performs pixel selection by causing the amplifying transistor 25 to be in an operation state. As a result, the amplifying transistor 25 amplifies the inter-terminal voltage of the charge storage capacitor 28, and outputs it to the vertical signal line 17 via the selection transistor 26 as a signal voltage.

Next, when the second reset signal CRST becomes H at time t14 at which the selection signal SEL falls from H to L, the second reset transistor 27 becomes on again. This causes the inter-terminal voltage of the charge storage capacitor 28 and the voltage of the vertical signal line 17 to become the ground potential.

Next, when the first reset signal FRST becomes H at time t15 at which the second reset signal CRST falls, the first reset transistor 23 becomes on and resets the FD part 29. That is, the charge in the FD part 29 is discarded to the positive power source Vdd via the first reset transistor 23, as a result of which the FD part 29 is reset.

When the selection signal SEL becomes H at time t16 at which the first reset signal FRST falls, the selection transistor 26 becomes on again, so that a reset voltage of the FD part 29 is amplified by the amplifying transistor 25 via the charging transistor 24 and output to the vertical signal line 17. This reset voltage contains KTC noise associated with the reset of the FD part 29.

When the second reset signal CRST becomes H at time t17 at which the selection signal SEL falls, the second reset transistor 27 becomes on again and resets the charge storage capacitor 28. This completes the series of operation for reading the signal voltage and the reset voltage in one frame period.

The signal voltage output at time t13 and the reset voltage output at time t16 are sequentially supplied to the column processing part 13 shown in FIG. 1, via the vertical signal line 17. Pixel-specific fixed pattern noise and Vth variations are removed by the CDS process performed in the column processing part 13. The signal after noise removal is converted to a digital signal by an AD converter provided, for example, in the column processing part 13 and output.

[Effects of the Embodiment]

As described above, by adding the charge storage capacitor 28 for temporarily storing a charge to the unit pixel 20 in an X-Y address type solid-state imaging device such as the CMOS image sensor 10, it is possible to achieve the global shutter function of performing exposure for all pixels at the same timing.

Moreover, by interposing the charging transistor 24 between the FD part 29 and the charge storage capacitor 28 and charging the charge storage capacitor 28 by the charging transistor 24 by the current corresponding to the charge of the FD part 29, the following effect can be attained. That is, since the charge storage capacitor 28 is not connected in parallel with the FD part 29, the capacitance value of the charge storage capacitor 28 does not affect the capacitance value of the FD part 29.

This makes it possible to satisfy both the charge retention time of the charge storage capacitor 28 and the conversion efficiency of the FD part 29 which are in a tradeoff relationship. In detail, by setting a large capacitance value of the charge storage capacitor 28, an extended charge retention time of the charge storage capacitor 28 and improved noise immunity can be attained without a decrease in conversion efficiency of the FD part 29.

In addition, the global shutter function can be achieved with a small number of components, where only one charge storage capacitor 28 and two transistors 24 and 27 are added to each unit pixel 20. Hence, a solid-state imaging device of high integration can be realized without a decrease in conversion efficiency of the FD part 29. Furthermore, with regard to signals for driving the unit pixel, it is sufficient to add only the second reset signal CRST. Thus, the change to the circuit structure of the vertical driving part 12 can be minimized.

<3. Another Embodiment>

The embodiment described earlier relates to an example of the circuit structure of each individual unit pixel 20 including the charge storage capacitor 28. On the other hand, another embodiment relates to an example of a circuit structure in which the components of the unit pixel 20 are partially shared between a plurality of pixels. An example where the components are partially shared between four adjacent pixels in the same pixel column is used here.

[Circuit Structure]

Figure 4:
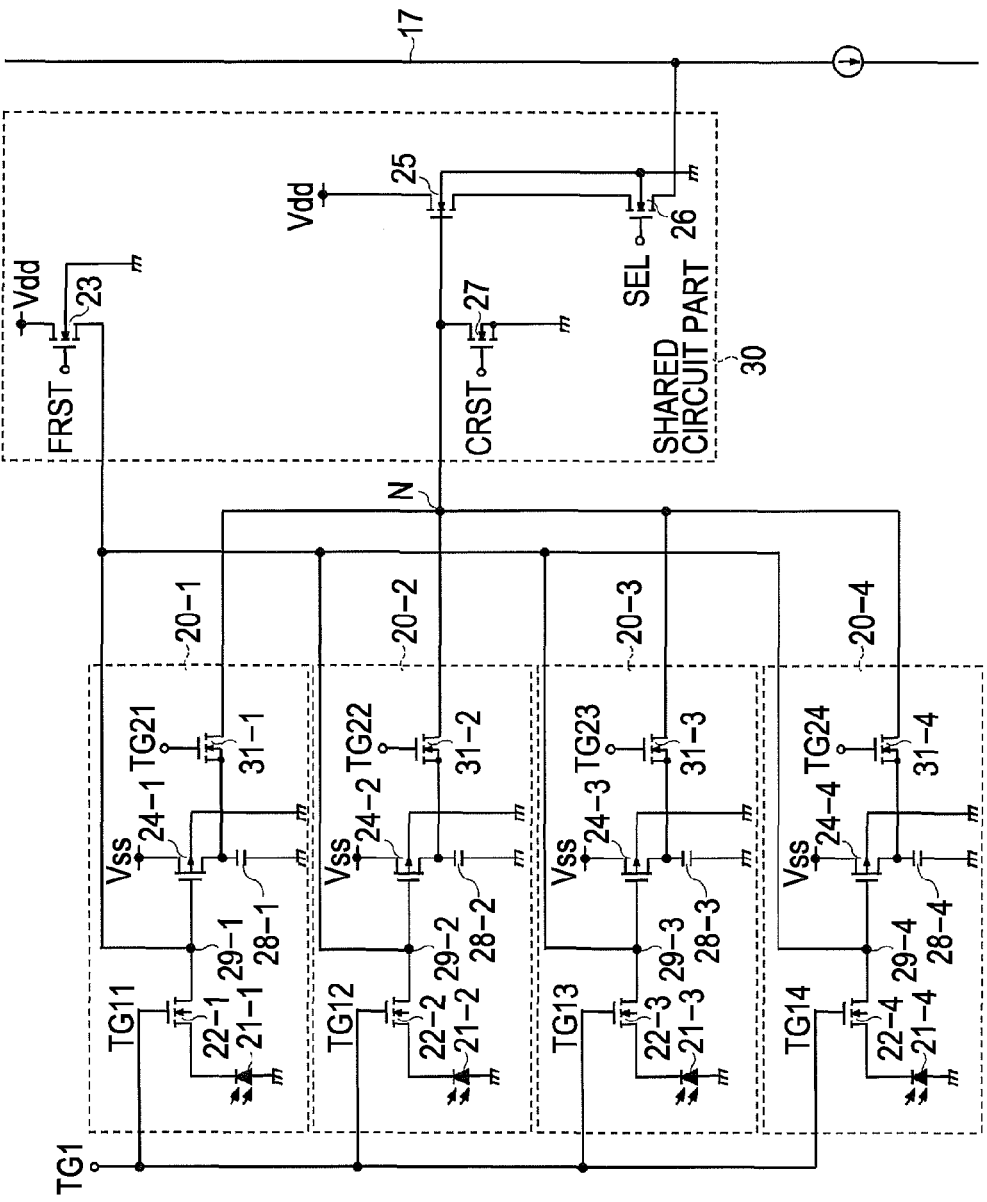
FIG. 4 is a circuit diagram showing a circuit structure of pixel sharing according to another embodiment of the present invention.

FIG. 4 is a circuit diagram showing a circuit structure of the unit pixel 20 according to another embodiment. In the drawing, the same portions as those in FIG. 2 are given the same reference numerals.

When partially sharing the components of the unit pixel 20 between four pixels 20-1 to 20-4, at least two components including the amplifying transistor 25 and the selection transistor 26 are shared between the four pixels. Though the first reset transistor 23 and the second reset transistor 27 are also shared between the four pixels in this example, the embodiment of the present invention is not limited to the sharing of both the first reset transistor 23 and the second reset transistor 27, and either the first reset transistor 23 or the second reset transistor 27 may instead be shared.

The unit pixel 20-1 includes a photodiode 21-1, a first transfer transistor 22-1, a charging transistor 24-1, a charge storage capacitor 28-1, an FD part 29-1, and a second transfer transistor 31-1.

The photodiode 21-1 has an anode electrode grounded, and a cathode electrode connected to one main electrode of the first transfer transistor 22-1. The other main electrode of the first transfer transistor 22-1 is connected to the FD part 29-1.

The charging transistor 24-1 has a gate electrode connected to the FD part 29-1, and a drain electrode connected to the negative power source Vss. The charge storage capacitor 28-1 is connected between a source electrode of the charging transistor 24-1 and the ground.

The second transfer transistor 31-1 which is a transfer gate is provided for pixel sharing, and connected between one terminal of the charge storage capacitor 28-1 (the source electrode of the charging transistor 24-1) and a common node N. This second transfer transistor 31-1 becomes on when an active high second transfer signal TG21 is applied to its gate electrode, and supplies a signal of the unit pixel 20-1 to a shared circuit part 30.

The unit pixels 20-2, 20-3, and 20-4 have the same structure as the unit pixel 20-1.

The shared circuit part 30 includes the first reset transistor 23, the amplifying transistor 25, the selection transistor 26, and the second reset transistor 27. The first reset transistor 23 has a drain electrode connected to the positive power source Vdd, and a source electrode connected to each of the FD parts 29-1 to 29-4 of the unit pixels 20-1 to 20-4.

The amplifying transistor 25 has a gate electrode connected to the common node N, and a drain electrode connected to the positive power source Vdd. The selection transistor 26 has a drain electrode connected to a source electrode of the amplifying transistor 25, and a source electrode connected to the vertical signal line 17. The second reset transistor 27 has a drain electrode connected to the common node N, and a source electrode grounded.

[Circuit Operation]

Figure 5:
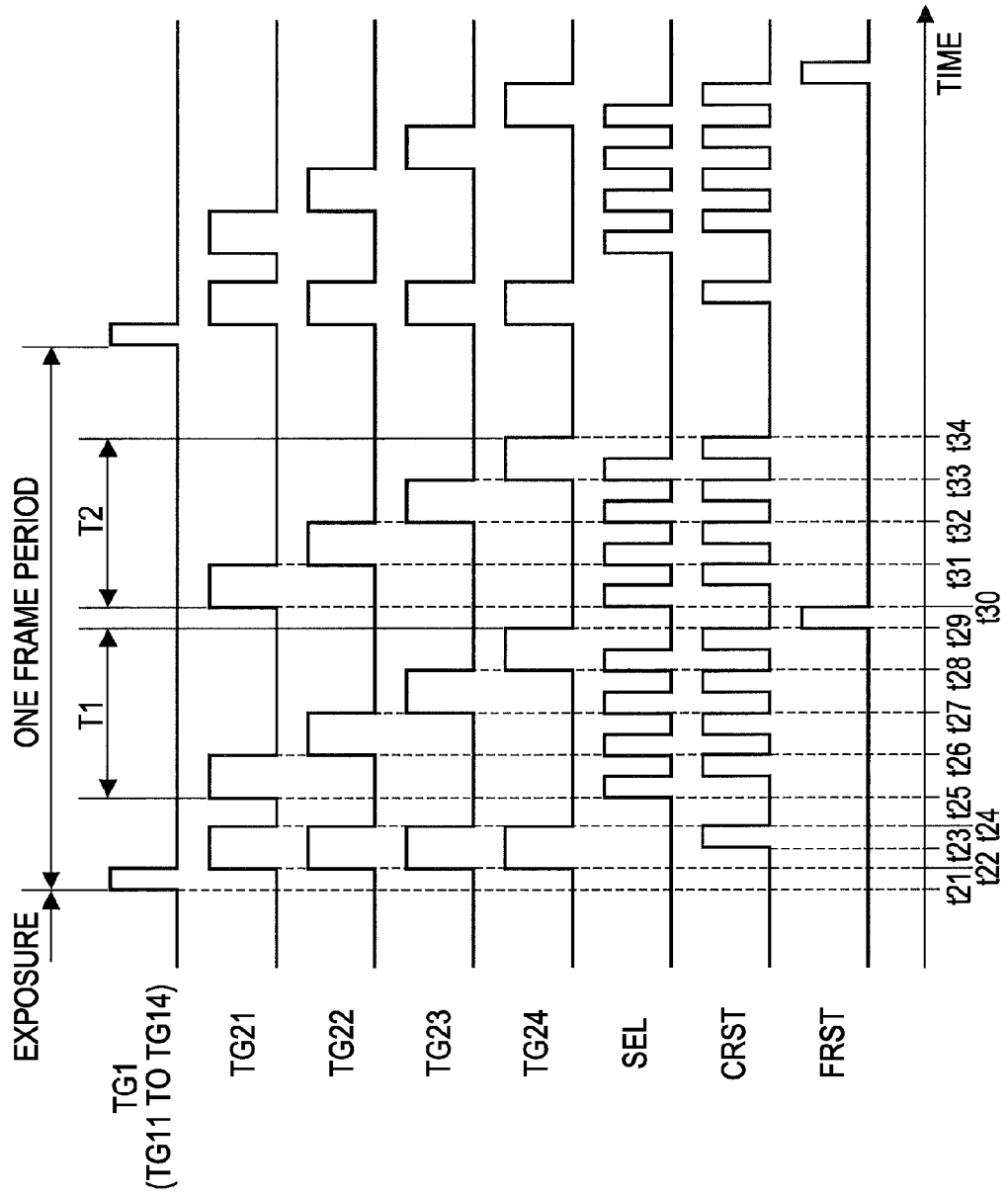
FIG. 5 is a timing chart for explaining a circuit operation of pixel sharing according to the other embodiment.

The following describes a circuit operation of the unit pixel 20 (20-1 to 20-4) in the aforementioned pixel sharing case, using the timing chart of FIG. 5. The timing chart of FIG. 5 shows timing relationships of the pulses that are a first transfer signal TG1 (TG11 to TG14), second transfer signals TG21 to TG24, the selection signal SEL, the first reset signal FRST, and the second reset signal CRST.

When the first transfer signal TG1 becomes H at time t21 at which exposure ends, the first transfer transistors 22-1 to 22-4 become on and transfer charges stored in the photodiodes 21-1 to 21-4 to the FD parts 29-1 to 29-4. The FD parts 29-1 to 29-4 perform charge-to-voltage conversion, thereby generating voltages corresponding to the amounts of charges transferred from the photodiodes 21-1 to 21-4. The voltages generated in the FD parts 29-1 to 29-4 are applied to the respective gate electrodes of the charging transistors 24-1 to 24-4 as input voltages.

Next, the second transfer signals TG21 to TG24 all become H at time t22 at which the first transfer signal TG1 falls, and then the second reset signal CRST becomes H at time t23. As a result, the second reset transistor 27 becomes on and resets all of the charge storage capacitors 28-1 to 28-4.

At this time, since the FD parts 29-1 to 29-4 are not reset, the charges transferred from the photodiodes 21-1 to 21-4 are retained in the FD parts 29-1 to 29-4. Accordingly, the input voltages corresponding to the amounts of charges in the photodiodes 21-1 to 21-4 are continuously applied to the respective gate electrodes of the charging transistors 24-1 to 24-4 via the FD parts 29-1 to 29-4.

Subsequently, at the same time as the second reset signal CRST transitions from H to L at time t24, the charging transistors 24-1 to 24-4 feed currents corresponding to the charges in the FD parts 29-1 to 29-4, that is, the input voltages, through the charge storage capacitors 28-1 to 28-4, thereby charging the capacitors 28-1 to 28-4.

After charging the charge storage capacitors 28-1 to 28-4, the second transfer signal TG21 becomes H at time t25, the second transfer signal TG22 becomes H at time t26, the second transfer signal TG23 becomes H at time t27, and the second transfer signal TG24 becomes H at time t28, in this order. At the same time with these, the selection signal SEL also becomes H. As a result, the inter-terminal voltages of the charge storage capacitors 28-1 to 28-4 are sequentially amplified by the amplifying transistor 25, and output to the vertical signal line 17 via the selection transistor 26.

A period T1 from time t25 at which the second transfer signal TG21 rises to time t29 at which the second transfer signal TG24 falls is a reading period during which the signal voltages of the four unit pixels 20-1 to 20-4 are read. In this signal voltage reading period T1, while the second transfer signals TG21 to TG24 are H, the second reset signal CRST becomes H synchronously with the transition of the selection signal SEL from H to L.

Following this, the first reset signal FRST becomes H at time t29, as a result of which the first reset transistor 23 becomes on and resets the FD parts 29-1 to 29-4. Subsequently, the second transfer signal TG21 becomes H at time t30 at which the first reset signal FRST falls, the second transfer signal TG22 becomes H at time t31, the second transfer signal TG23 becomes H at time t32, and the second transfer signal TG24 becomes H at time t33, in this order. At the same time with these, the selection signal SEL also becomes H. Accordingly, the reset voltages in the FD parts 29-1 to 29-4 are sequentially amplified by the amplifying transistor 25, and output to the vertical signal line 17 via the selection transistor 26.

Subsequently, a period from time t30 at which the second transfer signal TG21 rises to time t34 at which the second transfer signal TG24 falls is a reading period T2 during which the reset voltages of the four unit pixels 20-1 to 20-4 are read. In this reset voltage reading period T2, too, while the second transfer signals TG21 to TG24 are H, the second reset signal CRST becomes H synchronously with the transition of the selection signal SEL from H to L.

[Effects of the Embodiment]

As described above, even in the case of adopting a circuit structure in which the components of the unit pixel 20 are partially shared between a plurality of pixels, the global shutter function can be achieved by providing the charge storage capacitor 28 in each unit pixel 20. Moreover, by interposing the charging transistor 24 between the FD part 29 and the charge storage capacitor 28, it is possible to satisfy both the charge retention time of the charge storage capacitor 28 and the conversion efficiency of the FD part 29 which are in a tradeoff relationship, as in the embodiment described earlier.

In addition, by employing the pixel sharing circuit structure, the global shutter function can be achieved with a very small number of components, where only one capacitor 28 and three transistors 22, 24, and 31 are provided per pixel in this example. This makes it possible to realize a solid-state imaging device of higher integration than the embodiment described earlier.

<4. Charge Storage Capacitor>

The following describes the charge storage capacitor 28 (28-1 to 28-4) used in the pixel circuit according to each of the above embodiments.

The structure of the charge storage capacitor 28 added to each unit pixel 20 is not specifically limited. In view of high integration, however, a stack capacitor, a trench capacitor, and a junction capacitor are preferable. In particular, the stack capacitor has an advantage of ensuring a large capacitance value per unit area.

Moreover, by using a back-illuminated pixel structure as the pixel structure of the CMOS image sensor 10 to which an embodiment of the present invention is applied, a large area can be secured as a formation area of the charge storage capacitor 28 as compared with a front surface incident type pixel structure. When a large formation area of the charge storage capacitor 28 can be secured, a large capacitance value of the charge storage capacitor 28 can be set accordingly. This contributes to an extended charge retention time of the charge storage capacitor 28 and improved noise immunity. The back-illuminated pixel structure mentioned here is a structure in which, when a wiring layer side is set as a front surface, incident light is captured from a back surface which is opposite to the wiring layer side.

[Back-illuminated Pixel Structure]

Figure 6:
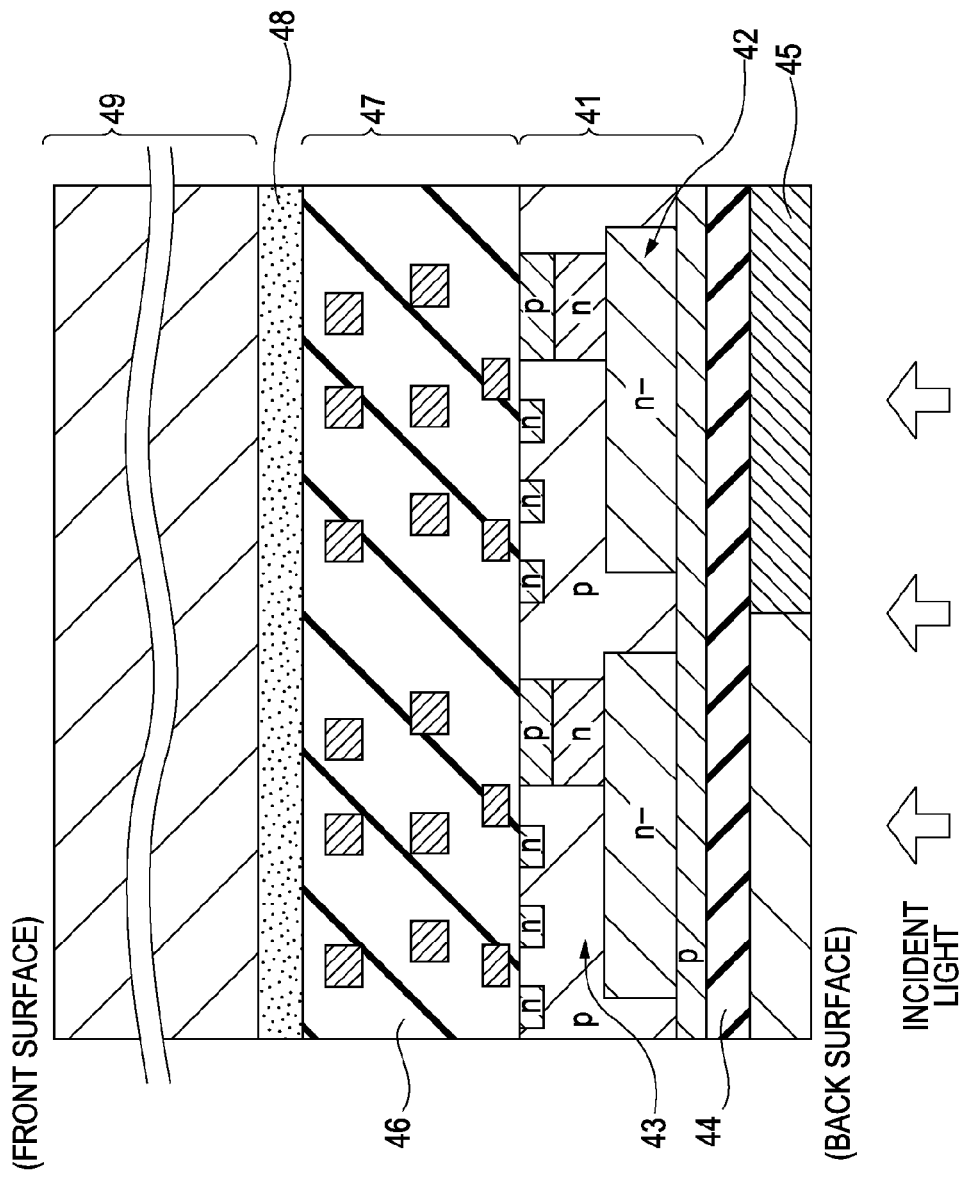
FIG. 6 is a sectional view showing an example of a back-illuminated pixel structure.

FIG. 6 is a sectional view showing an example of the back-illuminated pixel structure. A cross section of two pixels is shown here.

In FIG. 6, a photodiode 42 and a pixel transistor 43 are formed in a silicon part (silicon substrate) 41. That is, the silicon part 41 is a device forming part. Here, the photodiode 42 corresponds to the photodiode 21 in FIG. 2 or the photodiodes 21-1 to 21-4 in FIG. 4. The pixel transistor 43 corresponds to the transfer transistor 22 and the like in FIG. 2, or the transfer transistors 22-1 to 22-4 and the like in FIG. 4.

A color filter 45 is formed on one surface of the silicon part 41 via an interlayer film 44. Accordingly, light incident from one surface of the silicon part 41 is guided to a light receiving surface of the photodiode 42 via the color filter 45. Meanwhile, a wiring layer 47 made by multilayer-wiring a gate electrode of the pixel transistor 43 and metal wires in an interlayer insulating film 46 is formed on the other surface of the silicon part 41. A support substrate 49 is attached to an opposite surface of the wiring layer 47 to the silicon part 41, by an adhesive 48.

In the above pixel structure, the wiring layer 47 side of the silicon part 41 in which the photodiode 42 and the pixel transistor 43 are formed is referred to as the front surface, and the opposite side of the silicon part 41 to the wiring layer 47 is referred to as the back surface. Based on such definition, this pixel structure is the back-illuminated pixel structure because incident light is captured from the back surface of the silicon part 41.

According to this back-illuminated pixel structure, incident light is captured from the surface opposite to the wiring layer 47, so that an aperture ratio of 100% can be attained. Moreover, the wiring layer 47 is not present on the side where incident light is captured. This allows incident light to be gathered on the light receiving surface of the photodiode 42 without using an on-chip lens.

[Stack Capacitor]

A structure of the charge storage capacitor 28 that is applied to the back-illuminated pixel structure and formed using a stack capacitor is described below, as an example.

Figure 7:
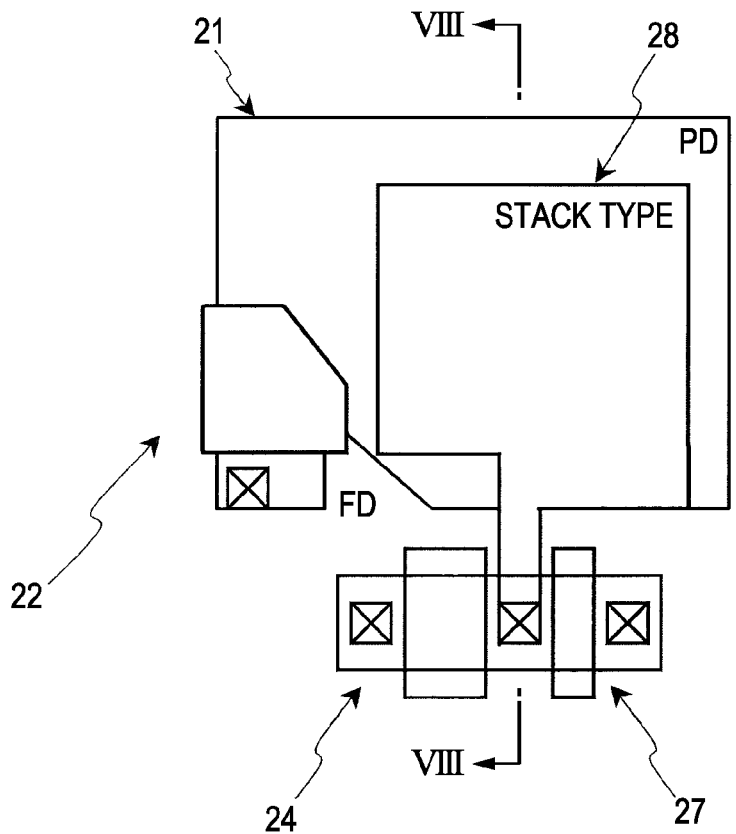
FIG. 7 is a plan view schematically showing a pixel layout when a charge storage capacitor is formed using a stack capacitor.
Figure 8:
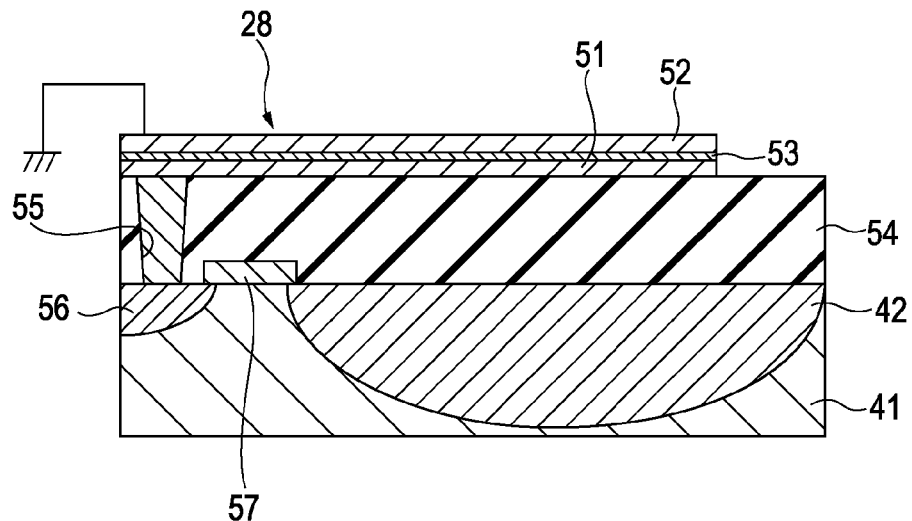
FIG. 8 is a sectional view showing a cross section taken along the line VIII-VIII in FIG. 7.

FIG. 7 is a plan view schematically showing a pixel layout when the charge storage capacitor 28 is formed using a stack capacitor. In FIG. 7, the same portions as those in FIG. 2 are given the same reference numerals. FIG. 8 shows a cross section taken along the line VIII-VIII in FIG. 7.

As is clear from FIG. 7, the back-illuminated pixel structure has no constraint for incident light, so that the charge storage capacitor 28 composed of a stack capacitor can be placed on an interlayer insulating film 54 over a wide area of the photodiode (PD) 21. By placing the charge storage capacitor 28 on the photodiode 21 in this way, it is possible to enhance a PD filling rate per unit cell. In particular, by using a stack capacitor as the charge storage capacitor 28, a large capacitance value of the charge storage capacitor 28 can be set.

In FIG. 8, the same portions as those in FIG. 6 are given the same reference numerals. As shown in FIG. 8, the charge storage capacitor 28 composed of a stack capacitor can be realized by sandwiching a dielectric 53 between a lower electrode 51 and an upper electrode 52.

As an electrode material of the lower electrode 51 and the upper electrode 52, a material that has a high melting point and a low diffusion coefficient in silicon, such as tungsten and tantalum nitride, is desirable. As a material of the dielectric 53, a material that has a high dielectric constant and a small leakage current, such as silicon dioxide, silicon nitride, hafnium dioxide, zirconium dioxide, and tantalum pentoxide, is desirable.

The lower electrode 51 is electrically connected to a diffusion layer 56 which serves as a source region of the charging transistor 24 shown in FIG. 2, via a contact via 55 formed in the interlayer insulating film 54 (corresponding to the interlayer insulating film 46 in FIG. 6). The upper electrode 52 is grounded. A device isolation region 57 is provided between the diffusion layer 56 and the photodiode 42 (the photodiode 21 in FIG. 2).

<5. Modifications>

Though the signal voltage is read first and the reset voltage is read later in each of the above embodiments, the reading order may be reversed. That is, the reset voltage may be read first and the signal voltage read later. Even in this reading order, the noise removal process can be performed by taking the difference between the reset voltage and the signal voltage in a succeeding signal processing system.

Moreover, though each of the above embodiments is based on the assumption that the noise removal process and the AD conversion process are performed in the column processing part 13, these processes may instead be performed in a succeeding stage of the column processing part 13 or outside the semiconductor substrate (chip) 18.

Furthermore, though each of the above embodiments describes the case of applying to a CMOS image sensor as an example, these embodiments are not limited thereto. That is, the embodiments can be applied to all X-Y address type solid-state imaging devices made by a matrix arrangement of unit pixels that each detect a charge corresponding to an amount of visible light as a physical quantity and output it as an electric signal.

The solid-state imaging device may be formed as one chip, or as a module having an imaging function in which an imaging part and a signal processing part or an optical system are packaged altogether.

<6. Electronic Apparatus>

The embodiments of the present invention are not limited to the application to a solid-state imaging device, and are also applicable to an electronic apparatus such as an imaging apparatus. The electronic apparatus mentioned here denotes an image pickup apparatus (camera system) such as a digital still camera or a video camera, a mobile apparatus such as a mobile phone and a PDA (personal digital assistant) having an imaging function. The above module mounted on the electronic apparatus, namely, a camera module, may be an imaging apparatus.

[Imaging Apparatus]

Figure 9:
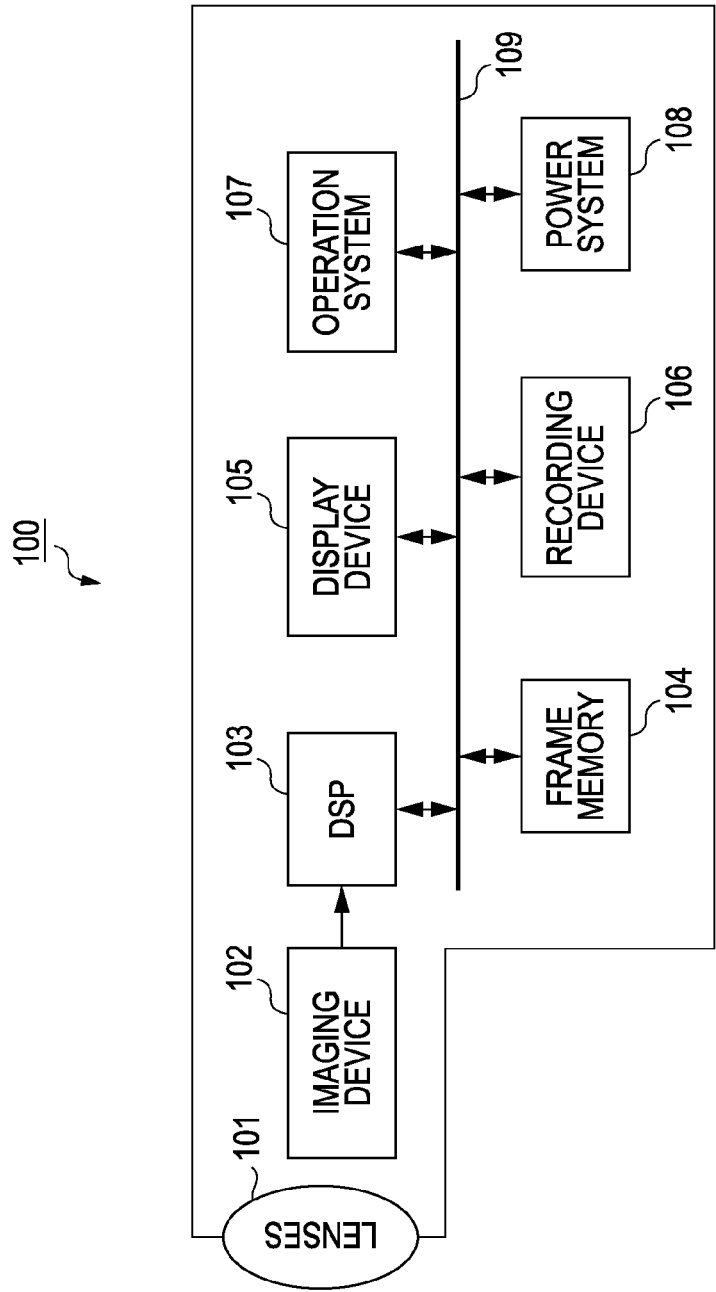
FIG. 9 is a block diagram showing an example of the structure of an imaging apparatus according to an embodiment of the present invention.

FIG. 9 is a block diagram showing an example of the structure of an imaging apparatus which is an example of an electronic apparatus according to an embodiment of the present invention. As shown in FIG. 9, an imaging apparatus 100 according to an embodiment of the present invention includes an optical system including lenses 101 and the like, an imaging device 102, a DSP circuit 103 which is a camera signal processing part, a frame memory 104, a display device 105, a recording device 106, an operation system 107, a power system 108, and the like. The DSP circuit 103, the frame memory 104, the display device 105, the recording device 106, the operation system 107, and the power system 108 are connected to each other via a bus line 109.

The lenses 101 capture incident light (image light) from a subject and form an image on an imaging surface of the imaging device 102. The imaging device 102 converts an amount of incident light the image of which is formed on the imaging surface by the lenses 101, to an electric signal per pixel, and outputs it as a pixel signal. The CMOS image sensor according to the above embodiments, that is, the CMOS image sensor that can achieve the global shutter function without a decrease in conversion efficiency of the FD part is used as the imaging device 102.

The display device 105 is composed of a panel display device such as a liquid crystal display device or an organic EL (electro luminescence) display device, and displays a moving or still image captured by the imaging device 102. The recording device 106 records the moving or still image captured by the imaging device 102, on a recording medium such as video tape or a DVD (digital versatile disk).

The operation system 107 issues operation instructions for various functions of the imaging apparatus, under user operations. The power system 108 appropriately supplies various power for the operations of the DSP circuit 103, the frame memory 104, the display device 105, the recording device 106, and the operation system 107, to these supply targets.

Such an imaging apparatus 100 is applied to a video camera, a digital still camera, and a camera module for a mobile apparatus such as a mobile phone. By using the CMOS image sensor according to the one of the embodiments described earlier as the imaging device 102, the CMOS image sensor can achieve the global shutter function without a decrease in conversion efficiency of the FD part. Hence, a captured image of high quality without distortion can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device having a plurality of unit pixels arranged therein, each unit pixel comprising:
   a photoelectric conversion element operative to generate a charge in response to incident light;
   a first storage element configured to store the charge generated by the photoelectric conversion element; and
   a second storage element configured to store a charge corresponding to the charge stored in the first storage element,
   wherein,
      for each pixel, the second storage element is at a surface facing away from a light receiving surface of the photoelectric conversion element.

2. The solid-state imaging device according to claim 1, wherein the first storage element is a floating diffusion region.

3. The solid-state imaging device according to claim 1, wherein the second storage element is a stack capacitor.

4. The solid-state imaging device according to claim 1, wherein each pixel further comprises, a charging configuration between the first storage second storage elements.

5. The solid-state imaging device according to claim 4, wherein the charging configuration includes a charging transistor configured to charge the second storage element with an amount corresponding to the charge in the first storage element.

6. The solid-state imaging device according to claim 1, wherein each pixel further comprises a first reset element configured to reset the first storage element.

7. The solid-state imaging device according to claim 6, wherein each pixel further comprises a second reset element configured to reset the second storage element.

8. A method of driving a solid-state imaging device having a plurality of unit pixels each comprising each unit pixel comprising (a) a photoelectric conversion element operative to generate a charge in response to incident light, (b) a first storage element configured to store a charge generated by the photoelectric conversion element (c) a second storage element configured to store a charge corresponding to the charge stored in the first storage element, the method comprising the steps of:

transferring the charge generated in the photoelectric conversion element to the first storage element, and charging the second storage element with the charge corresponding to the charge stored in the first storage element.

9. The method of claim 8, wherein the charge generated in the photoelectric conversion element is transferred to a floating diffusion region.

10. The method of claim 8, wherein the second storage element is charged with a capacitor.

11. An imaging system comprising:

a solid-state imaging device including a plurality of unit pixels each unit pixel comprising (1) a photoelectric conversion element operative to generate a charge in response to incident light, (2) a first storage element configured to store a charge generated by the photoelectric conversion element, and (3) a second storage element configured to store a charge corresponding to the charge stored in the first storage element; and a lens system configured to direct light on the pixels, wherein, for each pixel, the second storage element is at a surface facing away from a light receiving surface of the photoelectric conversion element.

12. The imaging system of claim 11, wherein, the first storage element is a floating diffusion region.

13. The imaging system of claim 11, wherein, the second storage element is a stack capacitor.

14. The imaging system of claim 11, further comprising, a charging configuration between the first and second storage elements.

15. The imaging system of claim 14, wherein the charging configuration includes a charging transistor configured to charge the second storage element with an amount corresponding to the charge stored in the first storage element.

16. The imaging system of claim 11, further comprising, a first reset element configured to reset the first storage element.

17. The imaging system of claim 16, further comprising, a second reset element configured to reset the second storage element.

* * * * *